US011121489B2

(12) United States Patent
Peng et al.

(10) Patent No.: US 11,121,489 B2
(45) Date of Patent: Sep. 14, 2021

(54) ELECTRICAL CONNECTOR WITH FLEXIBLE CIRCUIT AND STIFFENER

(71) Applicant: Seagate Technology LLC, Cupertino, CA (US)

(72) Inventors: Peng Peng, Eden Prairie, MN (US); William A. Casey, Nowthen, MN (US); Dennis L. Buster, East Bethel, MN (US); Kerry J. Johnson, Eden Prairie, MN (US); Ruth LeMon, Brooklyn Park, MN (US); Ronald E. Anderson, Lakeville, MN (US)

(73) Assignee: Seagate Technology LLC, Fremont, CA (US)

( * ) Notice: Subject to any disclaimer, the term of this patent is extended or adjusted under 35 U.S.C. 154(b) by 9 days.

(21) Appl. No.: 16/545,996

(22) Filed: Aug. 20, 2019

(65) Prior Publication Data

US 2021/0057835 A1 Feb. 25, 2021

(51) Int. Cl.
*H01R 12/61* (2011.01)
*H01R 12/71* (2011.01)
*H01R 12/77* (2011.01)
*H01R 13/66* (2006.01)
*H01R 12/55* (2011.01)
*H05K 3/32* (2006.01)
*H05K 3/36* (2006.01)
(Continued)

(52) U.S. Cl.
CPC ............. *H01R 12/61* (2013.01); *H01R 12/55* (2013.01); *H01R 12/716* (2013.01); *H01R 12/771* (2013.01); *H01R 13/6658* (2013.01); *H05K 1/189* (2013.01); *H05K 3/32* (2013.01); *H05K 3/361* (2013.01); *H05K 3/4007* (2013.01); *H05K 2201/04* (2013.01)

(58) Field of Classification Search
CPC .. H05K 1/14–147; H05K 1/118; H05K 1/189; H05K 3/323; H05K 3/365; H05K 3/32; H05K 3/361; H01R 12/55; H01R 12/61; H01R 12/78; H01R 12/29; H01R 13/6658
See application file for complete search history.

(56) References Cited

U.S. PATENT DOCUMENTS

| 4,116,517 A * | 9/1978 | Selvin .................... H05K 3/365 29/846 |
| 4,859,806 A * | 8/1989 | Smith ................... H05K 1/0289 174/261 |
| 5,716,229 A | 2/1998 | Loder et al. |

(Continued)

OTHER PUBLICATIONS

DuPont Kapton Summary of Properties, (Jan. 2017) 20 pages.

*Primary Examiner* — Edwin A. Leon
*Assistant Examiner* — Milagros Jeancharles
(74) *Attorney, Agent, or Firm* — Faegre Drinker Biddle & Reath LLP

(57) ABSTRACT

An electrical connector includes a flexible circuit with a flexible material and traces at least partially embedded in the flexible material. The electrical connector further includes a first set of conductive bumps, a second set of conductive bumps, and a stiffener. The first set of conductive bumps is coupled to respective first end portions of the traces and extends from a first side of the flexible circuit. The second set of conductive bumps is coupled to respective second end portions of the traces. The stiffener is coupled to the flexible circuit on a second side of the flexible circuit opposite the first side.

20 Claims, 9 Drawing Sheets

(51) Int. Cl.
    *H05K 1/18*   (2006.01)
    *H05K 3/40*   (2006.01)

(56) References Cited

U.S. PATENT DOCUMENTS

| | | | | |
|---|---|---|---|---|
| 5,717,547 A * | 2/1998 | Young | | G11B 5/486 |
| | | | | 360/246 |
| 6,926,565 B2 | 8/2005 | Fogg | | |
| 7,232,315 B2 * | 6/2007 | Uchida | | H01R 12/721 |
| | | | | 439/492 |
| 7,445,462 B2 * | 11/2008 | Kim | | H01R 12/79 |
| | | | | 439/67 |
| 7,452,213 B2 * | 11/2008 | Herdendorf | | G01R 1/0735 |
| | | | | 439/67 |
| 7,785,113 B2 * | 8/2010 | Mizoguchi | | H01R 12/58 |
| | | | | 439/67 |
| 9,450,320 B2 * | 9/2016 | Jung | | H01R 12/77 |
| 10,008,797 B2 * | 6/2018 | Hassan-Ali | | H01R 12/79 |
| 10,199,778 B2 | 2/2019 | Kim et al. | | |
| 2004/0240115 A1 * | 12/2004 | Hutchinson | | G11B 5/4833 |
| | | | | 360/245.9 |
| 2005/0106903 A1 * | 5/2005 | Tamagawa | | H01R 12/592 |
| | | | | 439/67 |
| 2005/0264924 A1 * | 12/2005 | Kimura | | G11B 5/012 |
| | | | | 360/97.11 |
| 2006/0006892 A1 * | 1/2006 | Green | | G01R 31/2886 |
| | | | | 324/754.03 |
| 2008/0064234 A1 * | 3/2008 | Herdendorf | | H01R 13/03 |
| | | | | 439/67 |
| 2008/0144273 A1 | 6/2008 | Mewes et al. | | |
| 2014/0004752 A1 * | 1/2014 | Sagayama | | H01R 24/005 |
| | | | | 439/670 |
| 2019/0279669 A1 * | 9/2019 | Mata | | G11B 5/4826 |

* cited by examiner

ELECTRICAL CONNECTOR WITH FLEXIBLE CIRCUIT AND STIFFENER

In certain embodiments, an electrical connector assembly includes an electrical connector. The electrical connector has a flexible circuit with a flexible material and traces at least partially embedded in the flexible material. The electrical connector further includes a first set of conductive bumps, a second set of conductive bumps, and a stiffener. The first set of conductive bumps is coupled to respective first end portions of the traces and extends from a first side of the flexible circuit. The second set of conductive bumps is coupled to respective second end portions of the traces. The stiffener is coupled to the flexible circuit on a second side of the flexible circuit opposite the first side.

In certain embodiments, an electrical connector includes a flexible circuit with a flexible, dielectric material and conductive traces at least partially embedded in the flexible material. The conductive traces include a pair of traces for transmitting differential signals and a trace for transmitting a ground reference signal. The electrical connector includes a first set of conductive bumps, a second set of conductive bumps, and a stiffener. The first set of conductive bumps is coupled to respective first end portions of the conductive traces and extending from a first side of the flexible circuit. The second set of conductive bumps is coupled to respective second end portions of the conductive traces. The stiffener is coupled to the flexible circuit on a second side of the flexible circuit opposite the first side.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
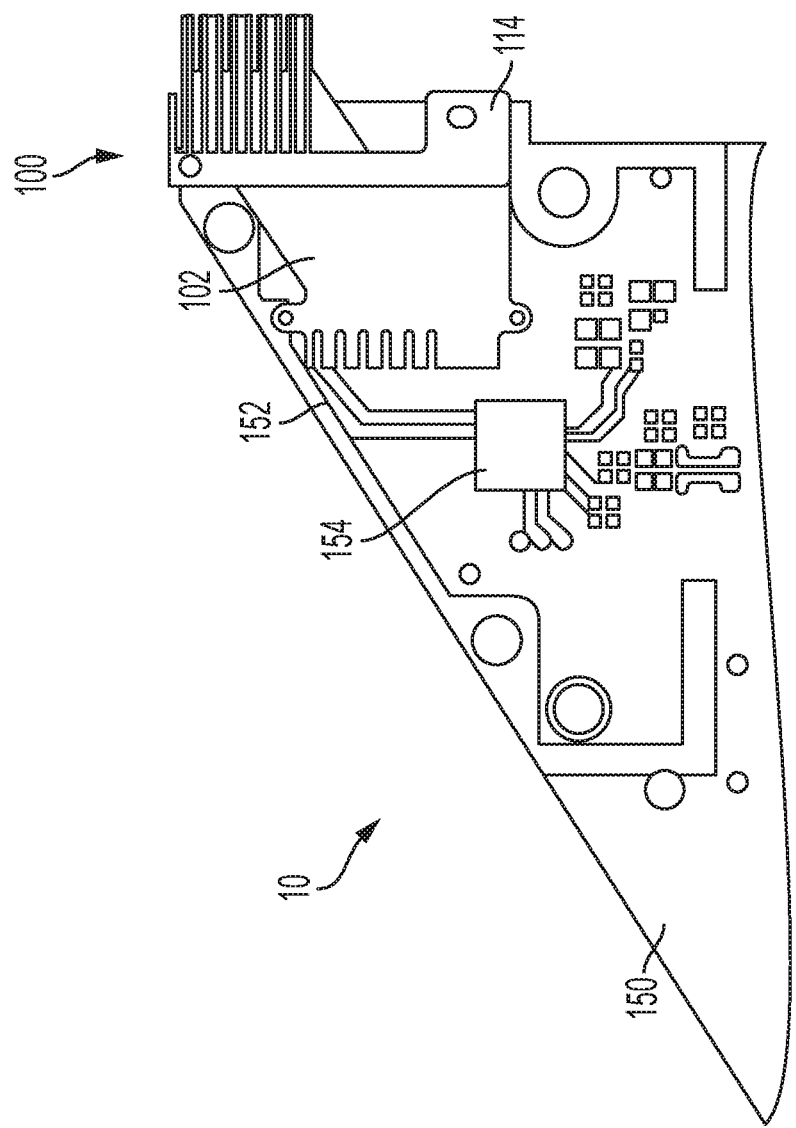
FIG. 1 shows a top view of an electrical connector assembly, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

FIG. 1 shows an electrical connector assembly 10 including an electrical connector 100 and a printed circuit board 150. As will be described in more detail below the electrical connector 100 can include features useful for transmitting data efficiently at high rates. Further, the electrical connector 100 can include features that are useful for repeatedly being connected and disconnected quickly.

Figure 2:
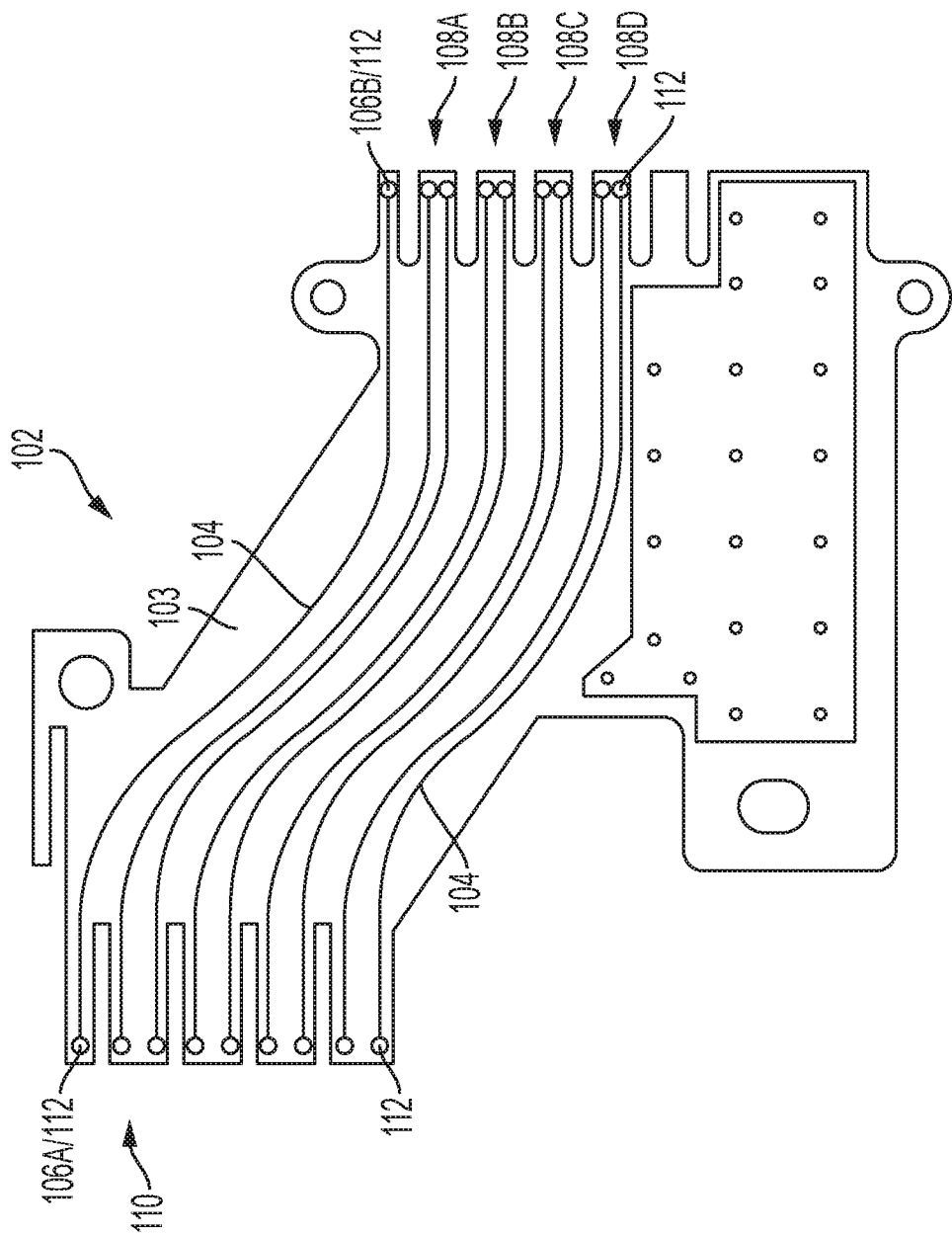
FIG. 2 shows a top view of a flexible circuit, in accordance with certain embodiments of the present disclosure.

The electrical connector 100 includes a flexible circuit 102, which is shown in more detail in FIG. 2. The side of the flexible circuit 102 shown in FIG. 2 is the opposite side of that shown in FIG. 1 The flexible circuit 102 comprises a flexible dielectric material 103 such as a polyimide, polyester, or liquid crystal polymer. In certain embodiments, the dielectric material 103 has a dielectric constant of 2.7-3.6. As shown in FIG. 2, the flexible circuit 102 includes traces 104 that extend between a first end portion 106A and a second end portion 106B. The traces 104 can comprise a conductive material such as copper and are at least partially embedded in the dielectric material 103. For example, the traces 104 may be embedded in the dielectric material 103 except that the first and the second end portions 106A and 1068 of the traces 104 may be exposed so that such portions can be electrically coupled to other components. In certain embodiments, at least some of the traces 104 are arranged in pairs (e.g., a first pair 108A, a second pair 108B, a third pair 108C, and a fourth pair 108D). For example, the electrical connector 100 may be arranged to transfer differential signals across respective pairs of traces 104. Alternatively or additionally, the electrical connector 100 may be arranged to transfer single-ended signals across individual traces 104. Further, the traces 104 can include a ground reference trace 110, which is one example of a trace 104 transferring single-ended signals.

The distance between the individual traces 104, the distance between the pairs of traces 104, the width of the traces 104 themselves, the thickness of the traces 104 themselves, and the thickness of the dielectric material 103 itself can be designed to be useful for transmitting data efficiently at high rates. In certain embodiments, the distance between the individual traces 104 ranges 2-20 mil, the distance between the pairs of traces 104 ranges 2-20 mil, the width of the traces 104 themselves ranges 2-20 mil, the thickness of the traces 104 themselves ranges 0.2-2 mil, and the thickness of the dielectric material 103 itself ranges 1-10 mil. In certain embodiments, the various distances, widths, and thicknesses of the traces 104 and the dielectric material 103 remains constant along the flexible circuit 102. As one example, the distance between the individual traces 104 in one or more pairs of traces 104 (e.g., the first pair 108A, the second pair 108B, the third pair 108C, and the fourth pair 108D) can remain substantially constant between the first and the second end portions 106A and 1066 of the traces 104.

Figure 3:
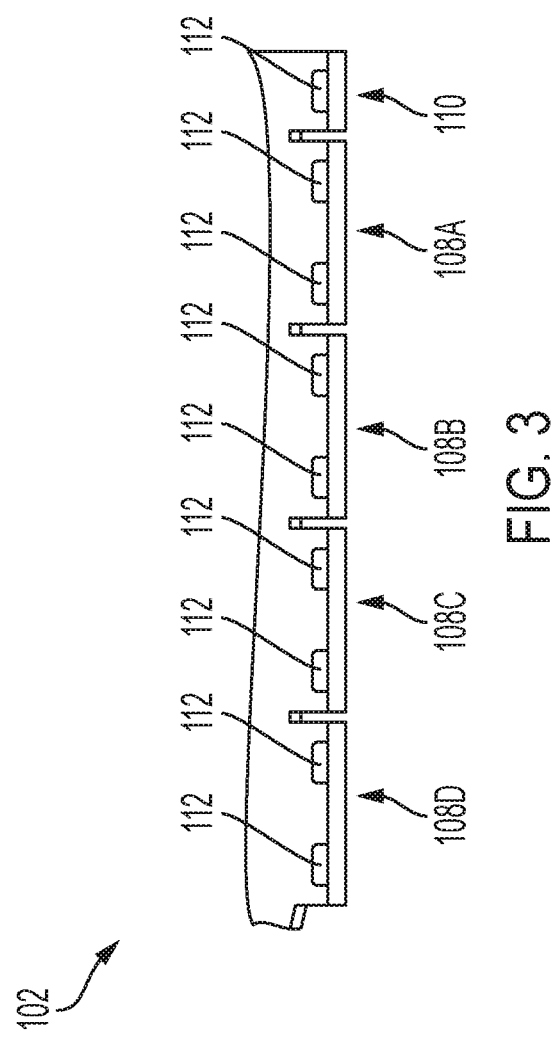
FIG. 3 shows a side view of a portion of the flexible circuit of FIG. 2, in accordance with certain embodiments of the present disclosure.

In certain embodiments, conductive bumps 112 are coupled to the first end portion 106A and the second end portion 106B. For example, in FIG. 2, the conductive bumps 112 include a first set of conductive bumps coupled to the first end portion 106A of the traces 104 and a second set of conductive bumps 112 coupled to the second end portion 106B of the traces 104. As such, the conductive bumps 112 and the traces 104 are electrically coupled to each other so that electrical signals can be transmitted from the first set of conductive bumps 112 to the traces 104 and then to the second set of conductive bumps 112. In certain embodiments, the conductive bumps 112 are circular shaped. In certain embodiments, the conductive bumps 112 comprise a conductive material such as gold. FIG. 3 shows a side view of the conductive bumps 112, which extend from the end portion 106A of the individual traces 104. In certain embodiments, the conductive bumps 112 are rounded as shown in FIG. 3 and substantially semi-circle shaped. In certain embodiments, the conductive bumps 112 have a height ranging from 1-10 mil.

With the features described above, the flexible circuit 102 can provide impedance-controlled paths for signals at bandwidths of at least up to 22 GHz. For example, the flexible circuit 102 can have a shorter rise time compared to flexible circuits that do not use conductive bumps or similar conductive structures. In certain embodiments, the impedance of the signal paths (both single-ended signal paths and differential signal paths) is controlled across a range of 25-200 Ohms. These characteristics are particularly useful for applications involving high data rate transmissions. For example, for hard disk drives using heat-assisted magnetic recording (HAMR), certain signals are transmitted at rates between 3 and 4 Gigabits per second. These signals include signals transmitted between preamplifiers and read/write heads of the hard disk drives or during testing of such read/write heads (e.g., when the read/write heads are coupled to spin stands). It can be challenging to transfer signals at such speeds without experiencing significant losses across an electrical connector.

Figure 4:
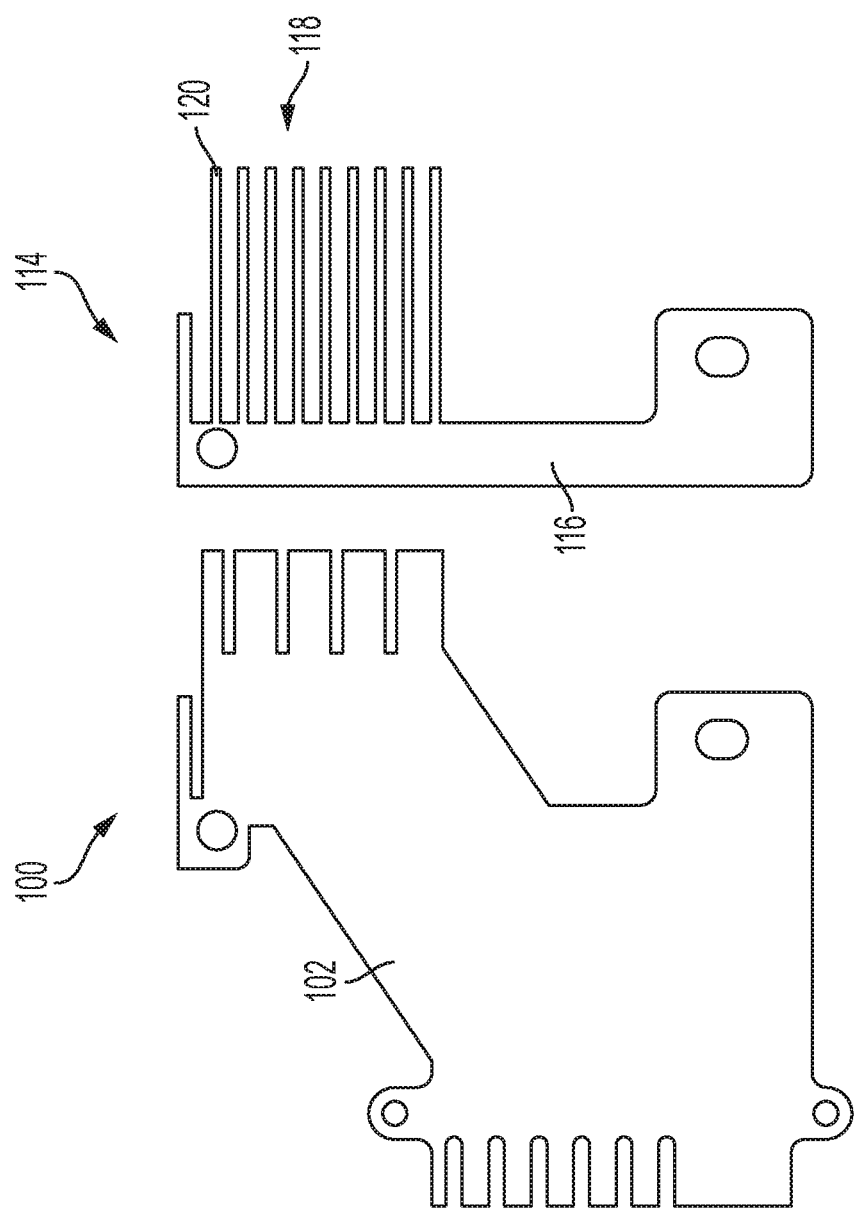
FIG. 4 shows a top, exploded view of an electrical connector, which includes the flexible circuit of FIGS. 2 and 3 and a stiffener, in accordance with certain embodiments of the present disclosure.
Figure 5:
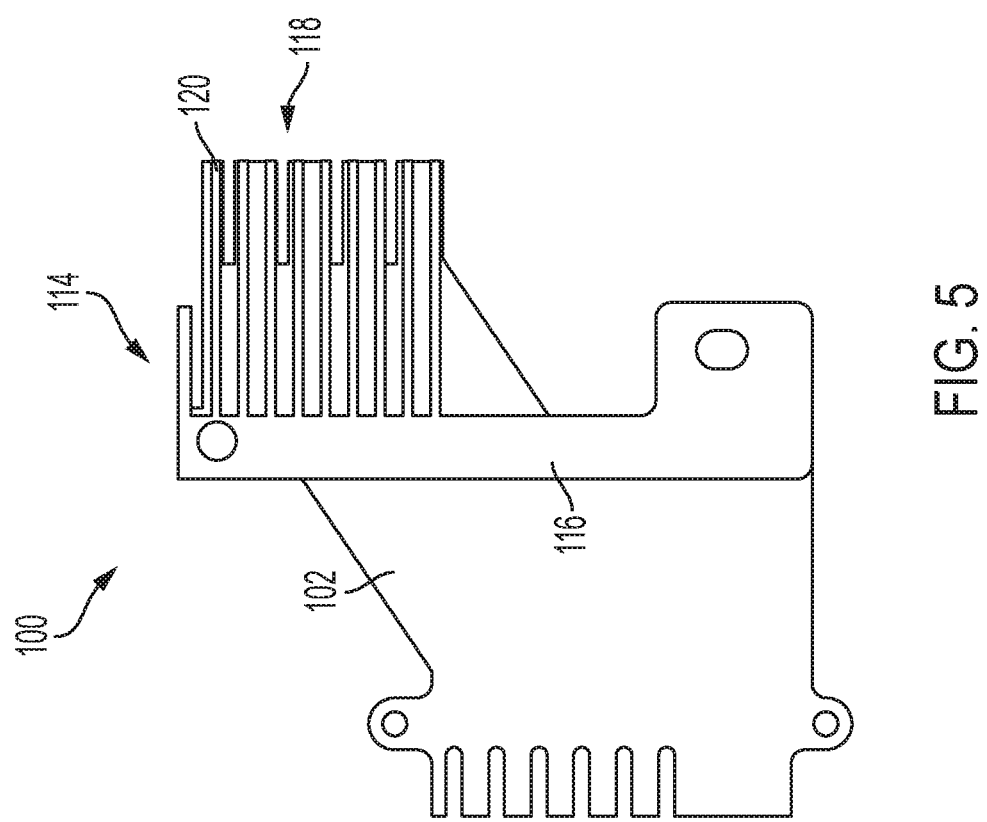
FIG. 5 shows a top, assembled view of the electrical connector of FIG. 4, in accordance with certain embodiments of the present disclosure.

FIG. 4 shows the flexible circuit 102 (the opposite side from the side shown in FIG. 2) and a stiffener 114, and FIG. 5 shows the flexible circuit 102 and the stiffener 114 assembled together (e.g., laminated together).

The stiffener 114 includes a body portion 116 and fingers 118 that extend from the body portion 116. When the stiffener 114 is attached to the flexible circuit 102, the fingers 118 of the stiffener 114 extend from the body portion 116 such that a distal portion 120 of each of the fingers 118 is positioned adjacent the first set of conductive bumps 112 positioned on an opposite side of the flexible circuit 102. The fingers 118 of the stiffener 114 provide a spring force to bias the first set of conductive bumps 112 such that the first set of conductive bumps 112 contact corresponding electrical contacts (e.g., conductive electrical pads or separate conductive traces) of a separate device (e.g., a printed circuit board or a flexible circuit) to which the electrical connector 100 is coupled. Put another way, the fingers 118 of the stiffener 114 help provide a mechanical force to couple the first set of conductive bumps 112 to corresponding electrical contacts. In certain embodiments, the stiffener 114 is comprised of a single piece such that the body portion 116 and the fingers 118 are integrally formed. In certain embodiments, the stiffener 114 comprises a material such as a metal (e.g., copper, beryllium, and other metals and alloys) or plastic.

Figure 6:
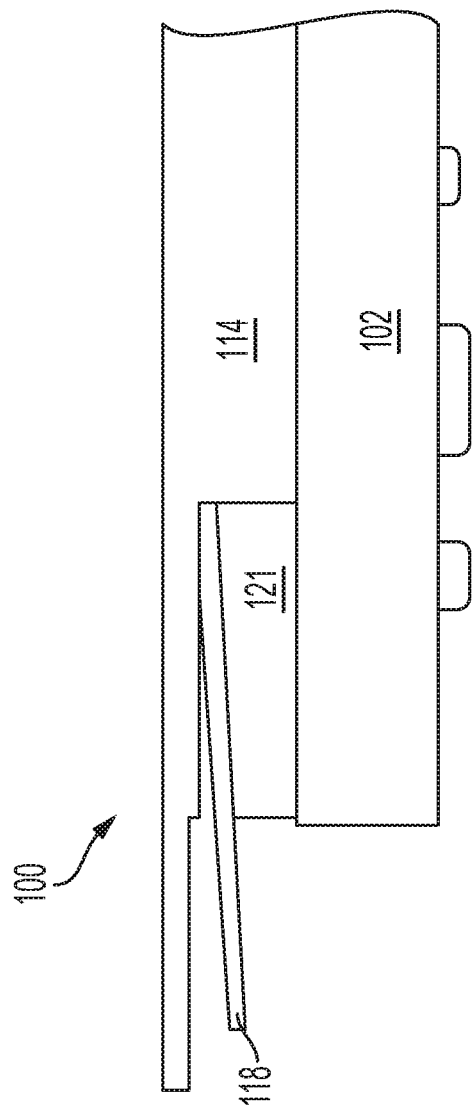
FIG. 6 shows a side view of a portion of the electrical connector of FIGS. 4 and 5, in accordance with certain embodiments of the present disclosure.

FIG. 6 shows a side view of the stiffener 114 and the flexible circuit 102. A spacer 121 is positioned between at least a portion of the stiffener 114 and the flexible circuit 102. The spacer 121 is shaped such that the fingers 118 are angled (e.g., a contact angle) towards the flexible circuit 102. For example, the spacer 121 can be shaped such that the fingers 118 have an angle of 1-10 degrees (e.g., 1, 2, 3, 4, 5, 6, 7, 8, 9, or 10 degrees) towards the flexible circuit 102.

As mentioned above, the stiffener 114 provides a spring force to bias the first set of conductive bumps 112 against corresponding electrical contacts. As such, when a component such as a separate flexible circuit or a head-gimbal assembly for a hard disk drive is connected to the electrical connector 100, the conductive bumps 112 are pressed against the component in a clamp-like fashion such that the conductive bumps 112 initiate and maintain a mechanical and electrical connection with the component. The connection can be initiated quickly and maintained without requiring a separate latch or other mechanical component—a characteristic that can be useful in automated manufacturing environments. Further, the connection can be initiated and maintained without using solder to make the connection. As such, the electrical connector 100 can be electrically connected and unconnected multiple times. In certain embodiments, the electrical connector 100 includes structures that help guide components towards the conductive bumps 112 along a desired path. Further, such structures can help provide a backstop for helping to clamp the components against the conductive bumps 112.

Although the stiffener 114 is shown with multiple, separate fingers 118, the stiffener 114 could utilize other features to provide a spring force to bias the first set of conductive bumps 112. For example, if a stronger spring force was desired, the stiffener 114 could include fewer but wider and/or thicker fingers 118. Further, although the stiffener 114 is shown as having one finger 118 for each pair of conductive bumps 112, the stiffener 114 could include one finger 118 for each conductive bump 112.

Turning back to FIG. 1, the electrical connector 100 is mechanically and electrically coupled to the printed circuit board 150. For example, the second set of conductive bumps 112 of the electrical connector 100 can be mechanically and electrically coupled to electrical pads (not shown) on the printed circuit board 150. The electrical pads can be part of or coupled to traces 152 on the printed circuit board 150. The traces 152 can be coupled to a chip package 154 such that the electrical connector 100 is electrically coupled to the chip package 154. The chip package 154 can include an integrated circuit such as a preamplifier for use with data storage components. In certain embodiments, the flexible circuit 102 itself can include one or more chip packages that are directly coupled to traces 104 of the flexible circuit 102.

Although the electrical connector 100 is described as being connectable on one end to the printed circuit board 150 and on the other end to a separate component, the electrical connector 100 can be used between any number of electrical components. For example, the electrical connector 100 could include another stiffener or the stiffener 114 could be modified from the design shown in the figures such that both ends of the electrical connector 100 can be quickly connected and disconnected from electrical components.

Figure 7:
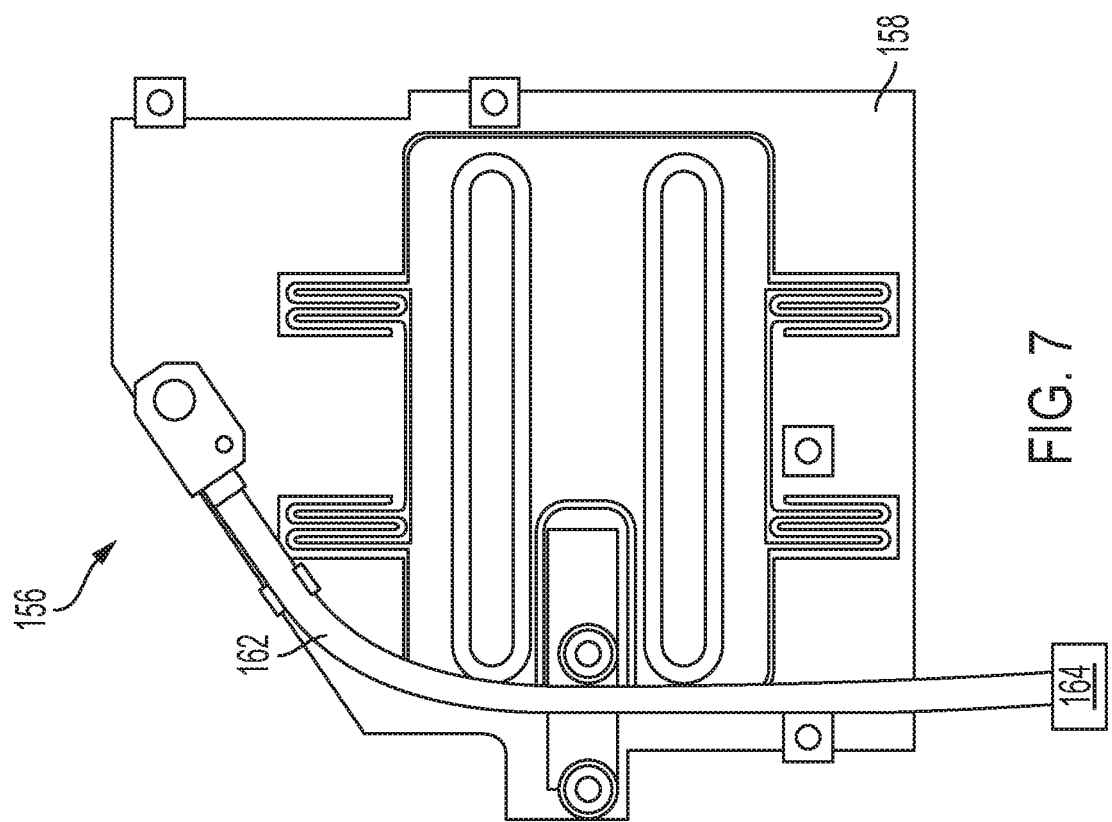
FIG. 7 shows a top view of a cover, in accordance with certain embodiments of the present disclosure.
Figure 8:
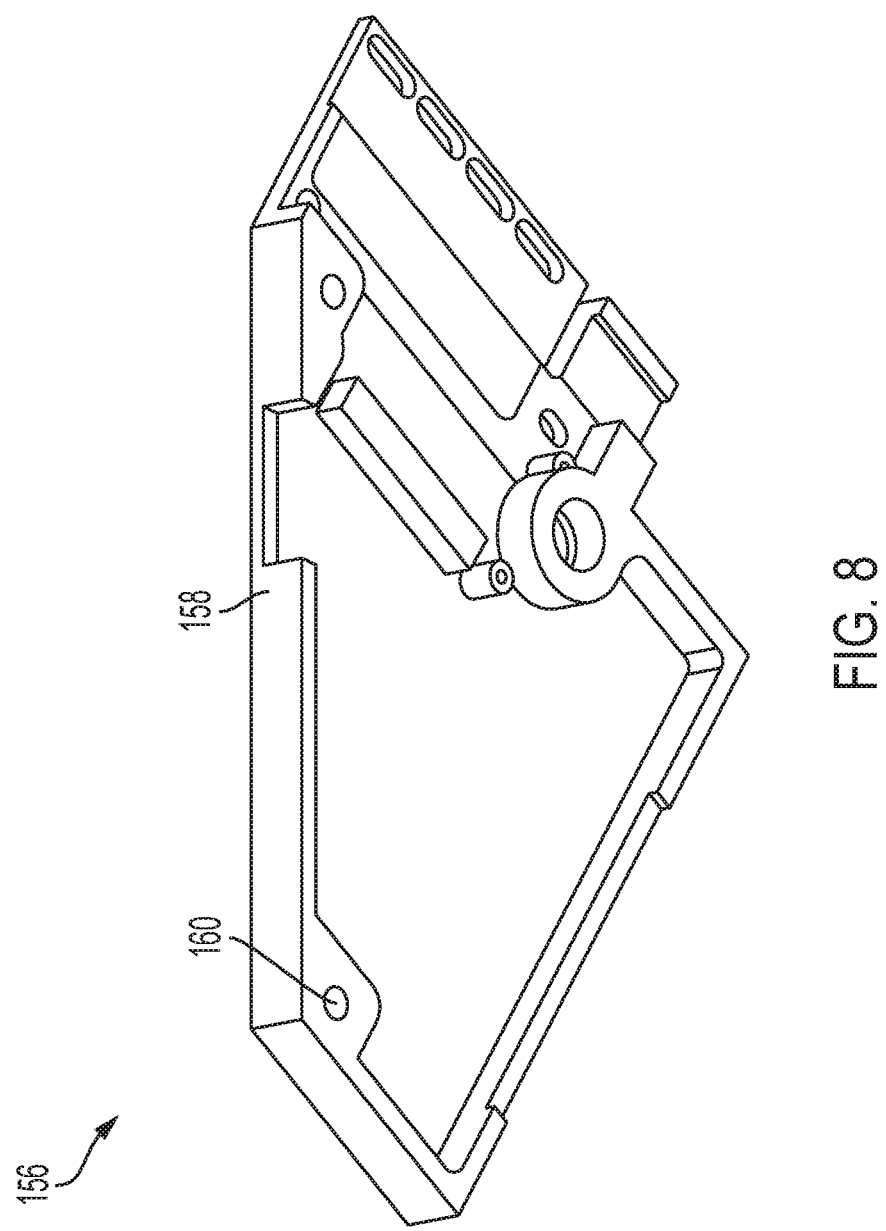
FIG. 8 shows a bottom view of the cover of FIG. 7, in accordance with certain embodiments of the present disclosure.
Figure 9:
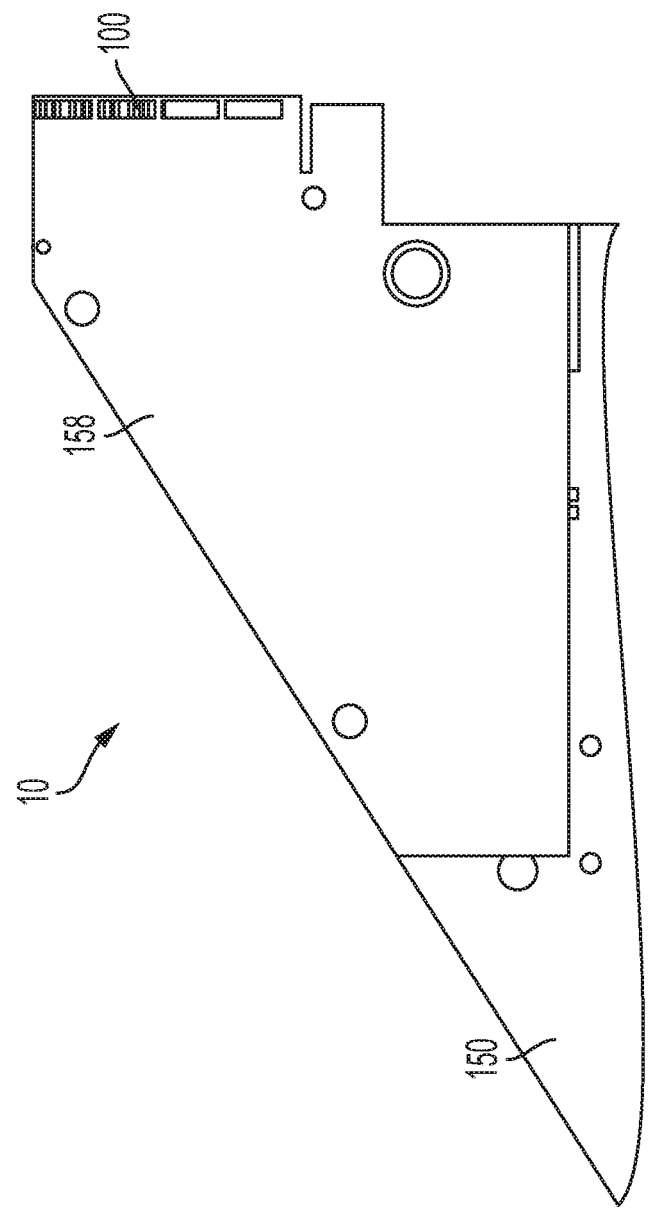
FIG. 9 shows a top view of the electrical connector assembly of FIG. 1 with the cover of FIGS. 7 and 8, in accordance with certain embodiments of the present disclosure.

During operation, the chip package 154 can be energized, which causes the chip package 154 to generate heat. To help keep the chip package 152 within a desired range of temperatures, the electrical connector assembly 10 can include a cooling assembly 156 (shown separately in FIGS. 7 and 8 and as part of the electrical connector assembly 10 in FIG. 9). The cooling assembly 156 can include a cover 158 that is coupled to the printed circuit board 150 to create a cavity in which the chip package 152 is positioned. In certain embodiments, the cover 158 comprises a material such as a metal or metal alloy (e.g., steel including stainless steel, copper, beryllium, and alloys of such) or a plastic.

The cover 158 can include an aperture 160 (shown in FIG. 8) that can be coupled to a tube 162 (shown in FIG. 7) or another type of conduit. The tube 162 can be coupled between the cover 158 and a vacuum source 164. During operation of the chip package 154, the vacuum source 164 can be powered and coupled to the electrical connector assembly 10 such that air is drawn from the cavity in which the chip package 152 is positioned. The vacuum source 164 removes heat from the cavity and also removes dust, etc., from the cavity. In certain embodiments, a thermal interface material can be positioned within the cavity between the chip package 154 and the cover 158 to further help transfer heat away from the chip package 154 via conductive heat transfer. In certain embodiments, the cover 158 is fastened to the printed circuit board 150 via one or more fasteners (e.g., screws).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

What is claimed is:

1. An electrical connector assembly comprising:
   an electrical connector including:
   a flexible circuit comprising a flexible material and traces at least partially embedded in the flexible material,
   a first set of conductive bumps coupled to respective first end portions of the traces, extending from a first side of the flexible circuit, and arranged to be electrically connected and unconnected multiple times to and from separate components,
   a second set of conductive bumps coupled to respective second end portions of the traces, and
   a stiffener coupled to the flexible circuit on a second side of the flexible circuit opposite the first side, the stiffener including a body and fingers that extend from the body such that the fingers provide a spring force against the first set of conductive bumps.

2. The electrical connector assembly of claim 1, wherein the conductive bumps of the first set of conductive bumps are circular shaped.

3. The electrical connector assembly of claim 1, wherein the conductive bumps of the first set of conductive bumps are rounded.

4. The electrical connector assembly of claim 1, wherein the first and the second sets of conductive bumps comprise gold.

5. The electrical connector assembly of claim 1, wherein the traces comprise copper.

6. The electrical connector assembly of claim 1, wherein the flexible material comprises a polyimide, a polyester, or a liquid crystal polymer.

7. The electrical connector assembly of claim 1, wherein the flexible material has a dielectric constant of 2.7-3.6.

8. The electrical connector assembly of claim 1, wherein at least some of the traces have a width of 2-20 mil.

9. The electrical connector assembly of claim 1, wherein at least some of the traces have a thickness of 0.2-2 mil.

10. The electrical connector assembly of claim 1, wherein the traces are spaced 2-20 mil from each other.

11. The electrical connector assembly of claim 1, further comprising:
    a printed circuit board coupled to a chip package, which is electrically coupled to the electrical connector.

12. The electrical connector assembly of claim 11, further comprising:
    a cover coupled to the printed circuit board to create a cavity in which the chip package is positioned, the cover including an aperture coupled to a tube.

13. The electrical connector assembly of claim 11, wherein the second set of conductive bumps are electrically coupled to electrical pads on the printed circuit board.

14. The electrical connector assembly of claim 1, wherein the stiffener is laminated to the flexible circuit.

15. An electrical connector comprising:
    a flexible circuit comprising a flexible, dielectric material and conductive traces at least partially embedded in the flexible material, the conductive traces including a pair of traces for transmitting differential signals and a trace for transmitting a ground reference signal;
    a first set of conductive bumps coupled to respective first end portions of the conductive traces, extending from a first side of the flexible circuit and arranged to be electrically connected and unconnected multiple times to and from separate components;
    a second set of conductive bumps coupled to respective second end portions of the conductive traces, and
    a stiffener coupled to the flexible circuit on a second side of the flexible circuit opposite the first side and arranged to provide a spring force against the first set of conductive bumps.

16. The electrical connector assembly of claim 15, wherein the conductive bumps of the first set of conductive bumps are circular shaped, are rounded, and comprise gold.

17. The electrical connector assembly of claim 15, wherein the flexible material comprises a polyimide, a polyester, or a liquid crystal polymer; wherein the conductive traces comprise copper; wherein the conductive traces have a width of 2-20 mil; wherein the conductive traces have a thickness of 0.2-2 mil; and wherein the conductive traces are spaced 2-20 mil from each other.

18. An electrical connector assembly comprising:
    an electrical connector including:
    a flexible circuit comprising a flexible material and traces at least partially embedded in the flexible material,
    a first set of conductive bumps coupled to respective first end portions of the traces and extending from a first side of the flexible circuit, wherein the first set of conductive bumps are rounded,
    a second set of conductive bumps coupled to respective second end portions of the traces, wherein the second set of conductive bumps are rounded, and
    a stiffener coupled to the flexible circuit on a second side of the flexible circuit opposite the first side, and
    a printed circuit board coupled to a chip package, which is electrically coupled to the electrical connector; and
    a cover directly coupled to the printed circuit board to create a cavity in which the chip package is positioned, the cover including an aperture coupled to a hollow tube.

19. The electrical connector assembly of claim 18, wherein the second set of conductive bumps are electrically coupled to electrical pads on the printed circuit board.

20. The electrical connector assembly of claim 18, wherein the first and the second sets of conductive bumps comprise gold.

* * * * *